(12) United States Patent
Bal et al.

(10) Patent No.: US 10,862,503 B2
(45) Date of Patent: Dec. 8, 2020

(54) CLOCK JITTER MEASUREMENT USING SIGNAL-TO-NOISE RATIO DEGRADATION IN A CONTINUOUS TIME DELTA-SIGMA MODULATOR

(71) Applicant: STMicroelectronics International N.V., Schiphol (NL)

(72) Inventors: Ankur Bal, Greater Noida (IN); Rupesh Singh, Ghaziabad (IN)

(73) Assignee: STMicroelectronics International N.V., Schiphol (NL)

(*) Notice: Subject to any disclaimer, the term of this patent is extended or adjusted under 35 U.S.C. 154(b) by 0 days.

(21) Appl. No.: 16/702,246

(22) Filed: Dec. 3, 2019

(65) Prior Publication Data

US 2020/0186162 A1 Jun. 11, 2020

Related U.S. Application Data

(60) Provisional application No. 62/777,496, filed on Dec. 10, 2018.

(51) Int. Cl.
| | | |
|---|---|---|
| *H03M 3/00* | (2006.01) | |
| *G06F 1/10* | (2006.01) | |
| *H03K 3/037* | (2006.01) | |

(52) U.S. Cl.
CPC .............. *H03M 3/372* (2013.01); *G06F 1/10* (2013.01); *H03K 3/037* (2013.01); *H03M 3/50* (2013.01)

(58) Field of Classification Search
None
See application file for complete search history.

(56) References Cited

U.S. PATENT DOCUMENTS

| | | |
|---|---|---|
| 6,184,812 B1 | 2/2001 | Younis et al. |
| 7,151,474 B2 | 12/2006 | Ortmanns et al. |
| 7,487,055 B2 | 2/2009 | Le-Gall |
| 7,852,249 B2 | 12/2010 | Oliaei |
| 8,164,500 B2 | 4/2012 | Ahmed et al. |
| 8,169,352 B2 | 5/2012 | Somin et al. |
| 8,860,478 B2 | 10/2014 | Chen et al. |
| 9,716,509 B2 * | 7/2017 | Zhao ............... H03M 1/1245 |
| 2007/0164884 A1 | 7/2007 | Ihs |

(Continued)

OTHER PUBLICATIONS

Tortosa, et al: "Effect of Clock Jitter Error on the Performance Degradation of Multi-bit Continuous-Time ΣΔ Modulators With NRZ DAC," TEC2004-01752/MIC Jan. 2005 (6 pages).

(Continued)

*Primary Examiner* — Howard Williams
(74) *Attorney, Agent, or Firm* — Crowe & Dunlevy

(57) ABSTRACT

A continuous time Delta-Sigma (CT-ΔΣ) modulator has an input node configured to receive an input signal and an output node configured to output a digital output signal. The CT-ΔΣ modulator includes a feedback loop with a summation circuit configured to sum the digital output signal with a jitter perturbed test signal to generate a signal supplied to an input of a digital to analog converter circuit. A single tone signal is injected with a jitter error of a clock signal to generate the jitter perturbed test signal. A processing circuit processes the digital output signal to detect a signal to noise ratio of the CT-ΔΣ modulator. The detected signal to noise ratio is indicative of presence of jitter in the clock signal.

32 Claims, 5 Drawing Sheets

(56) References Cited

U.S. PATENT DOCUMENTS

| | | | | |
|---|---|---|---|---|
| 2010/0156686 A1* | 6/2010 | Kim | ............... | H03K 3/3565 |
| | | | | 341/143 |
| 2011/0182389 A1* | 7/2011 | Breems | ............... | H03D 7/00 |
| | | | | 375/346 |
| 2014/0368367 A1 | 12/2014 | Choi et al. | | |
| 2020/0186162 A1* | 6/2020 | Bal | ............... | G06F 1/10 |

OTHER PUBLICATIONS

Rashidzadeh, et al: "An All-Digital Self-Calibration Method for a Vernier-Based Time-to-Digital Converter," IEEE Transactions on Instrumentation and Measurement, vol. 59, No. 2, Feb. 2010, pp. 463-469.

Lee, et al: "A Low Noise, Wideband Digital Phase-Locked Loop Based on a New Time-to-Digital Converter With Subpicosecond Resolution," 2008 Symposium on VLSI Circuits Digest of Technocal Papers, 2008 IEEE, pp. 112-113.

Lee, et al: "A 9 b, 1.25 ps Resolution Coarse-Fine Time-to-Digital Converter in 90 nm CMOS that Amplifies Time Residue," IEEE Journal of Solid-State Circuits, vol. 43, No. 4, Apr. 2008, pp. 769-777.

Hsu et al: "BIST for Measuring Clock Jitter of Charge-Pump Phase-Locked Loops," IEEE Transactions on Instrumentation and Measurement, vol. 57, No. 2, Feb. 2008 (pp. 276-285).

Hashimoto, et al: "Time-to-Digital Converter With Vernier Delay Mismatch Compensation for High Resolution On-Die Clock Jitter Measurement," 2008 Symposium on VLSI Circuits Digest of Technical Papers, 2008 IEEE, pp. 166-167.

Nose, et al: "A 1-ps Resolution Jitter-Measurement Macro Using Interpolated Jitter Oversampling," IEEE Journal of Solid-State Circuits, vol. 41, No. 12, Dec. 2006, pp. 2911-2920.

A.H. Chan, G.W. Robert, "A Jitter Characterization System Using a Component-Invariant Vernier Delay Line", IEEE Transaction on Very Large Scale Integration Systems, vol. 12, No. 1, Jan. 2004.

Xia, et al: "On-Chip Jitter Measurement for Phase Locked Loops," Proceedings of the 17th IEEE International Symposium on Defect and Fault Tolerance in VLSI Systems (DFT'02), 2002 IEEE (9 pages).

Moon, et al: "Spectral Analysis of Time-Domain Phase Jitter Measurements," IEEE Transactions on Circuits and Systems—II: Analog and Digital Signal Processing, vol. 49, No. 5, May 2002, pp. 321-327.

Dubois, et al: "Ternary Stimulus for Fully Digital Dynamic Testing of SC ΣΔ ADCs," 2012 IEEE 18th International Mixed-Signal, Sensors, and Systems Test Workshop, 2012 IEEE, pp. 5-10.

Rolindez, et al: "A SNDR BIST for ΣΔ Analogue-to-Digital Converters," Proceedings of the 24th IEEE VLSI Test Symposium (VTS'06), 2006 IEEE (6 pages).

* cited by examiner

CLOCK JITTER MEASUREMENT USING SIGNAL-TO-NOISE RATIO DEGRADATION IN A CONTINUOUS TIME DELTA-SIGMA MODULATOR

PRIORITY CLAIM

This application claims priority from U.S. Provisional Application for Patent No. 62/777,496, filed Dec. 10, 2018, the contents of which are incorporated by reference in their entirety.

TECHNICAL FIELD

The present invention generally relates to the detection and measurement of clock jitter.

BACKGROUND

FIG. 1A shows the waveform of a clock signal in the form of a square wave signal having a period T. FIG. 1B shows the waveform of the clock signal, again in the form of a square wave signal, which exhibits a jitter phenomenon (i.e., clock edges are perturbed by jitter). Clock jitter is a deviation (reference 10) of a clock edge 12 from its ideal location 14, where the ideal location is specified by the period T. As a result, the actual period of the square wave signal may vary over time, positively and/or negatively, with respect to an ideal period T. The offset difference in periods is undesired in most circuit applications, and thus is it important to be able to test for and measure clock jitter.

One solution for testing for and measuring clock jitter is to use a very precise (i.e., jitter free, with high resolution and accuracy) external reference clock signal in comparison with the generated clock signal. This method is quite acceptable for jitter characterization of a generated clock signal having a relatively low frequency (for example, on the order of a few hundred kilohertz), but it less well suited for use when the generated clock signal has a relatively high frequency (for example, on the order of a few hundred megahertz to gigahertz).

There is a need in the art for a jitter detection and measurement technique which does not require the use of such a very precise external reference clock signal.

SUMMARY

In an embodiment, a circuit for detecting jitter in a clock signal comprises: a continuous time Delta-Sigma modulator circuit having an input node configured to receive an input signal, an output node configured to output a digital output signal, and a test input configured to receive a jitter perturbed test signal; a signal source circuit configured to generate a single tone signal; a jitter injection circuit configured to inject the jitter of the clock signal into the single tone signal to output the jitter perturbed test signal; and a processing circuit configured to process the digital output signal to detect a signal to noise ratio of the continuous time Delta-Sigma modulator circuit, wherein the signal to noise ratio is indicative of presence of jitter in the clock signal.

In an embodiment, a circuit for detecting jitter in a clock signal comprises: a continuous time Delta-Sigma modulator circuit having an input node configured to receive an input signal and an output node configured to output a digital output signal, wherein the continuous time Delta-Sigma modulator circuit includes a feedback loop with a summation circuit configured to sum the digital output signal with a jitter perturbed test signal to generate a signal supplied to an input of a digital to analog converter circuit; a signal source circuit configured to generate a single tone signal; a jitter injection circuit configured to inject the jitter of the clock signal into the single tone signal to output the jitter perturbed test signal; and a processing circuit configured to process the digital output signal to detect a signal to noise ratio of the continuous time Delta-Sigma modulator circuit, wherein the signal to noise ratio is indicative of presence of jitter in the clock signal.

In an embodiment, a circuit comprises: a signal source circuit configured to generate a single tone signal; a jitter injection circuit configured to inject a jitter error of a clock signal into the single tone signal to output a jitter perturbed test signal; a first switching circuit having a first input configured to receive a fixed voltage signal and a second input configured to receive the jitter perturbed test signal; a second switching circuit having a first input configured to receive the jitter perturbed test signal and a second input configured to receive the fixed voltage signal; and a continuous time Delta-Sigma modulator circuit. The continuous time Delta-Sigma modulator circuit comprises: a first summation circuit having a first input coupled to receive an output of the first switching circuit and a second input coupled to receive a feedback signal; a filter circuit having an input coupled to an output of the first summation circuit; a quantization circuit having an input coupled to an output of the filter circuit and an output configured to generate a digital output signal; and a feedback loop. The feedback loop includes: a second summation circuit having an first input coupled to receive the digital output signal and a second input coupled to receive an output of the second switching circuit; and a digital to analog converter circuit having an input coupled to receive an output of the second summation circuit and an output configured to generate the feedback signal.

BRIEF DESCRIPTION OF THE DRAWINGS

For a better understanding of the embodiments, reference will now be made by way of example only to the accompanying figures in which.

DETAILED DESCRIPTION

Figure 1A:
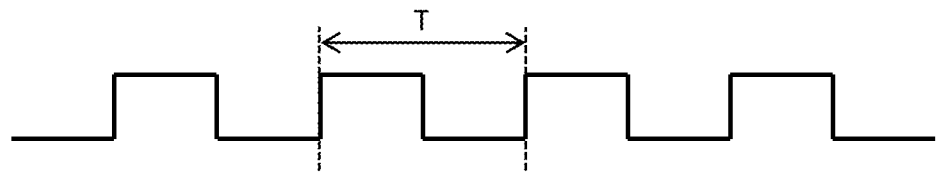
FIGS. 1A and 1B illustrate waveforms for clock signal which are, respectively, jitter-free and perturbed by jitter.
Figure 1B:
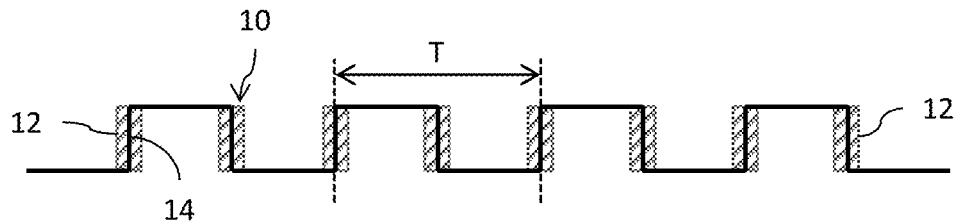
Figure 2A:
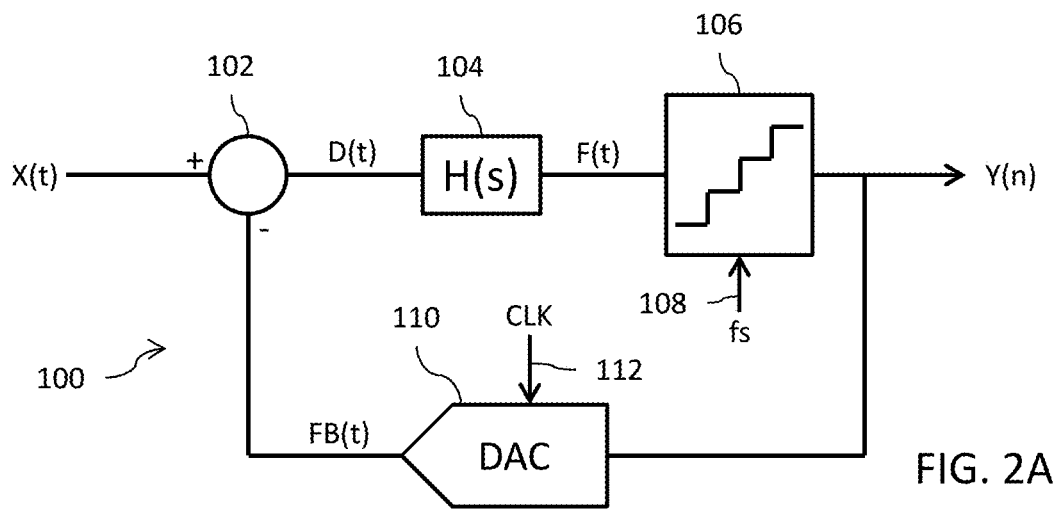
FIG. 2A is a block diagram of a continuous time (CT) Delta-Sigma ($\Delta\Sigma$) modulator.

Reference is now made to FIG. 2A which shows a block diagram of a single loop continuous time (CT) Delta-Sigma (ΔΣ) modulator 100. A summation circuit 102 has a first input configured to receive an input signal X(t) and a second input configured to receive a feedback signal FB(t). The summation circuit 102 generates a difference signal D(t) that is equal to the difference between the input signal X(t) and the feedback signal FB(t); i.e., D(t)=X(t)−FB(t). A filter 104 has an input configured to receive the difference signal D(t) and an output configured to generate a filtered signal F(t). The filter 104 has a transfer function of H(s) and is generally implemented as one or more integrator circuits (not explicitly shown). A quantization circuit (quantizer) 106 samples and quantizes the filtered signal F(t) at a sampling rate specified by a sampling signal 108 having a frequency fs to generate a digital output signal Y(n). A feedback loop of the CT-ΔΣ modulator includes a digital-to-analog converter (DAC) circuit 110 that converts the digital output signal Y(n) from the digital domain to the analog domain. The DAC circuit 110 is clocked for operation by a clock signal (CLK) 112 and operates to generate the feedback signal FB(t) as the analog conversion of the digital output signal Y(n).

A CT-ΔΣ modulator, like the circuit 100 shown in FIG. 2A, is known to those skilled in the art to be highly sensitive to clock jitter with respect to the clock signal (CLK) 112. Clock jitter has a proportional effect on the amount of feedback charge used by the DAC circuit 110 to generate the feedback signal FB(t). This charge error, which is injected in the feedback loop, is not noise shaped with respect to the output Y(n) and is directly fed back to the input of the modulator loop where it is integrated by the filter 104. This results in a degradation of the signal-to-noise ratio (SNR) performance of the CT-ΔΣ modulator. The adverse effect on SNR performance due to jitter is most pronounced in case of a single bit quantizer 106 generating the digital output signal Y(n) which applied to the input of a single bit DAC circuit 110. Thus, those skilled in the art understand that it is preferred for CT-ΔΣ modulator based analog-to-digital converter (ADC) circuits to instead use multi-level feedback (i.e., a multi-bit quantization and a multi-bit conversion) which tends to mitigate performance degradation due to jitter.

Figure 2B:
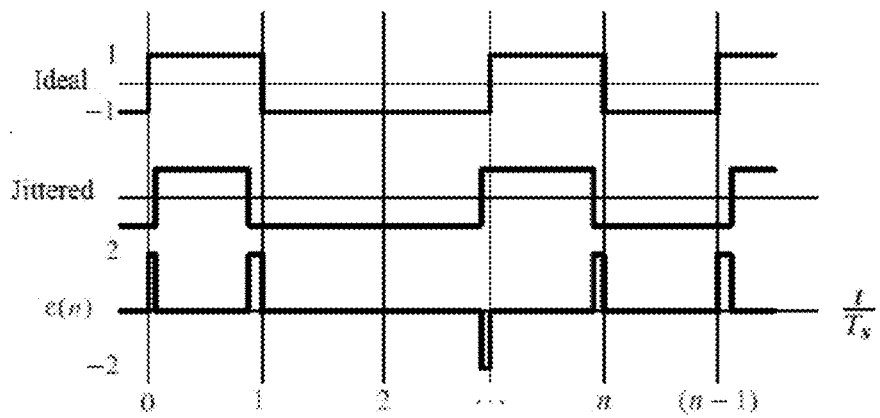
FIG. 2B illustrates an example comparison of a single-bit DAC output in the absence of and in the presence of clock jitter along with an illustration of the difference which corresponds to error caused by clock jitter.

FIG. 2B illustrates an example comparison of a single-bit Non Return to Zero (NRZ) DAC output in the absence of and in the presence of clock jitter along with an illustration of the difference which corresponds to error caused by the clock jitter. The CT-ΔΣ modulator output Y(n) changes with time and this jittered magnitude results in erroneous feedback. The jitter error can be related to the CT-ΔΣ modulator output Y(n) using the following relationship:

$$\varepsilon(n) = (Y(n) - Y(n-1))\frac{\Delta T(n)}{T_s} \quad (1)$$

where Ts is the sampling period and ΔT(n) is the pulse width change due to jitter.

Power of the jitter error signal expressed in terms of clock jitter standard deviation $\sigma_{\Delta T}$ is given by:

$$P_\varepsilon = E\{\varepsilon(n)^2\} = \frac{\sigma^2 \Delta T}{T_s^2} E\{(Y(n) - Y(n-1))^2\} \cong \cong \quad (2)$$

$$\frac{\sigma^2 \Delta T}{T_s^2} E\{(\Delta X_n)^2\} + E\{(q(n) - q(n-1))^2\}$$

where $\Delta X_n = [x(n)-x(n-1)]$. If Ntf(z) is the quantization noise function and e(z) is the quantization error, then the shaped quantization noise q(n) is given by:

$$q(n) = Ntf(z)e(z) \quad (3)$$

and:

$$E\{(\Delta q_n)^2\} = E\{(Z^{-1}[(1-z^{-1})Ntf(z)e(z)])^2\} == \quad (4)$$

$$\frac{X_{FS}^2}{12\pi(2^B-1)^2} \int_0^\pi |(1 - e^{-j\omega})Ntf(e^{-j\omega})|^2 d\omega$$

where $X_{FS}$ is full scale and B is the number of modulator quantizer bits. From equation (4), it can be seen that the expectation value of Δq(n) is inversely proportional to B. The conclusion to be drawn from the foregoing is that the dynamic performance of a CT-ΔΣ modulator with a single bit (B=1) quantizer will be most sensitive to jitter variations.

From equations (2) and (4), and with the assumption that the input signal X(t) is a sinewave of amplitude A having an angular frequency $\omega_i$, the power of the jitter error signal becomes:

$$P_\varepsilon \cong \left(\frac{\sigma_{\Delta T}}{T_s}\right)^2 \cdot \left(\frac{A^2 \omega_i^2}{2 f_s^2} + \frac{X_{FS}^2}{12\pi(2^B-1)^2} \int_0^\pi |(1 - e^{-j\omega})Ntf(e^{-j\omega})|^2 d\omega\right) \quad (5)$$

From the teaching of Tortos, et al., "Effect of Clock Jitter Error on the Performance Degradation of Multi-bit Continuous-Time ΣΔ Modulators With NRZ DAC" TEC2014-01752/MIC, January 2005 (incorporated by reference), state spacer representation techniques can be used to rewrite equation (5) and thus for a single bit quantizer the Signal to Noise ratio (SNR) is given by:

$$SNR_j = \frac{A^2/2}{B_w(\sigma_{\Delta T})^2 \cdot \left[\frac{A^2 \omega_i^2}{fs} + \frac{X_{FS}^2 \cdot fs}{3}\right]} \quad (6)$$

where A, $\omega_i$, $B_w$ are, respectively, the signal amplitude, angular frequency and bandwidth of the input signal and $\sigma_{\Delta T}$ is clock jitter standard deviation of the modulator clock.

With reference to equation (6), it can be clearly seen that the SNR performance of a CT-ΔΣ modulator is inversely proportional to the clock RMS jitter. This is important because the detected SNR then becomes, in effect, a proxy for detecting the system clock jitter. The solution to detecting and measuring system clock jitter, without need for a very precise external reference clock signal (as in the prior art), is accordingly to use the jitter sensitivity of a CT-ΔΣ modulator to estimate the system clock jitter through evaluation of the SNR performance of that CT-ΔΣ modulator.

Figure 3A:
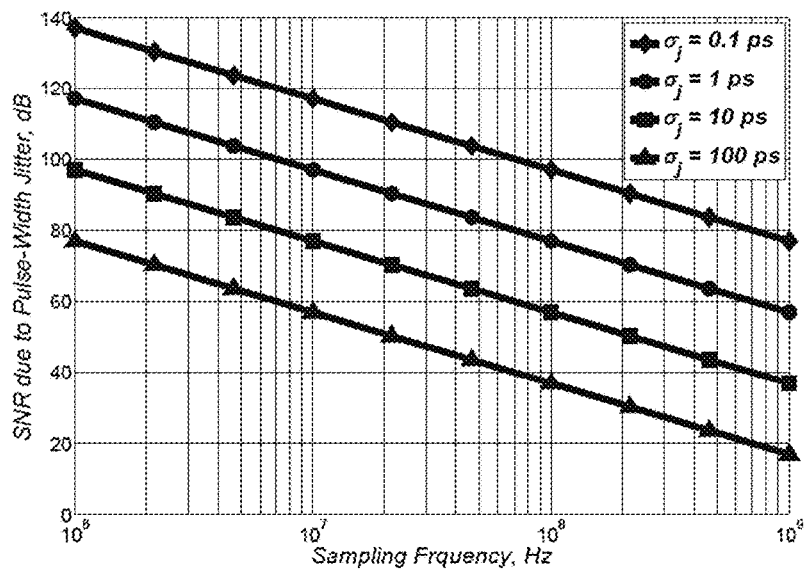
FIG. 3A is a graph which illustrates the relationship between SNR performance and sampling frequency for different values of clock RMS jitter.
Figure 3B:
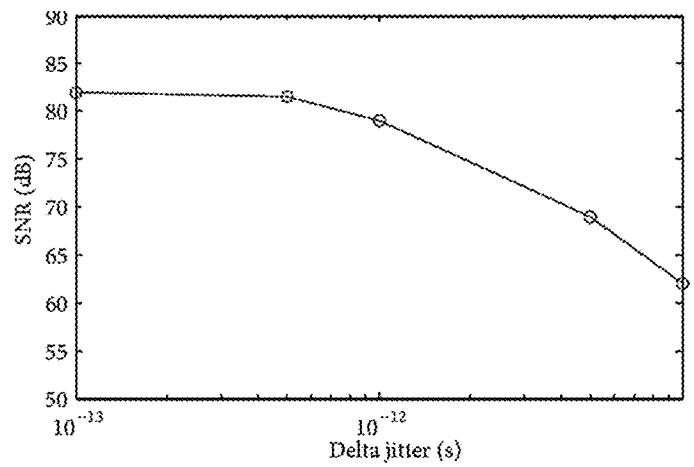
FIG. 3B is a graph which illustrates the relationship between SNR performance and delta jitter.
Figure 3C:
FIG. 3C is a graph which illustrates SNR performance of a CT-$\Delta\Sigma$ modulator output as a function of clock jitter.

FIG. 3A is a graph that illustrates the relationship between SNR performance and sampling frequency for different values of clock RMS jitter for a CT-ΔΣ modulator. FIG. 3B is a graph that illustrates the relationship between SNR performance and delta jitter for a CT-ΔΣ modulator. FIG. 3C illustrates signal to noise ratio (SNR) results for the CT-ΔΣ modulator for different values of clock jitter. It will be noted that SNR degradation is systematic and directly related to system clock jitter. The illustrated results are consistent with the prediction from equations (6) and (7). The systematic effect of jitter on SNR performance of a CT-ΔΣ modulator output is accordingly well established. From this, clock jitter characterization is possible by evaluating the SNR of the CT-ΔΣ modulator.

Figure 4:
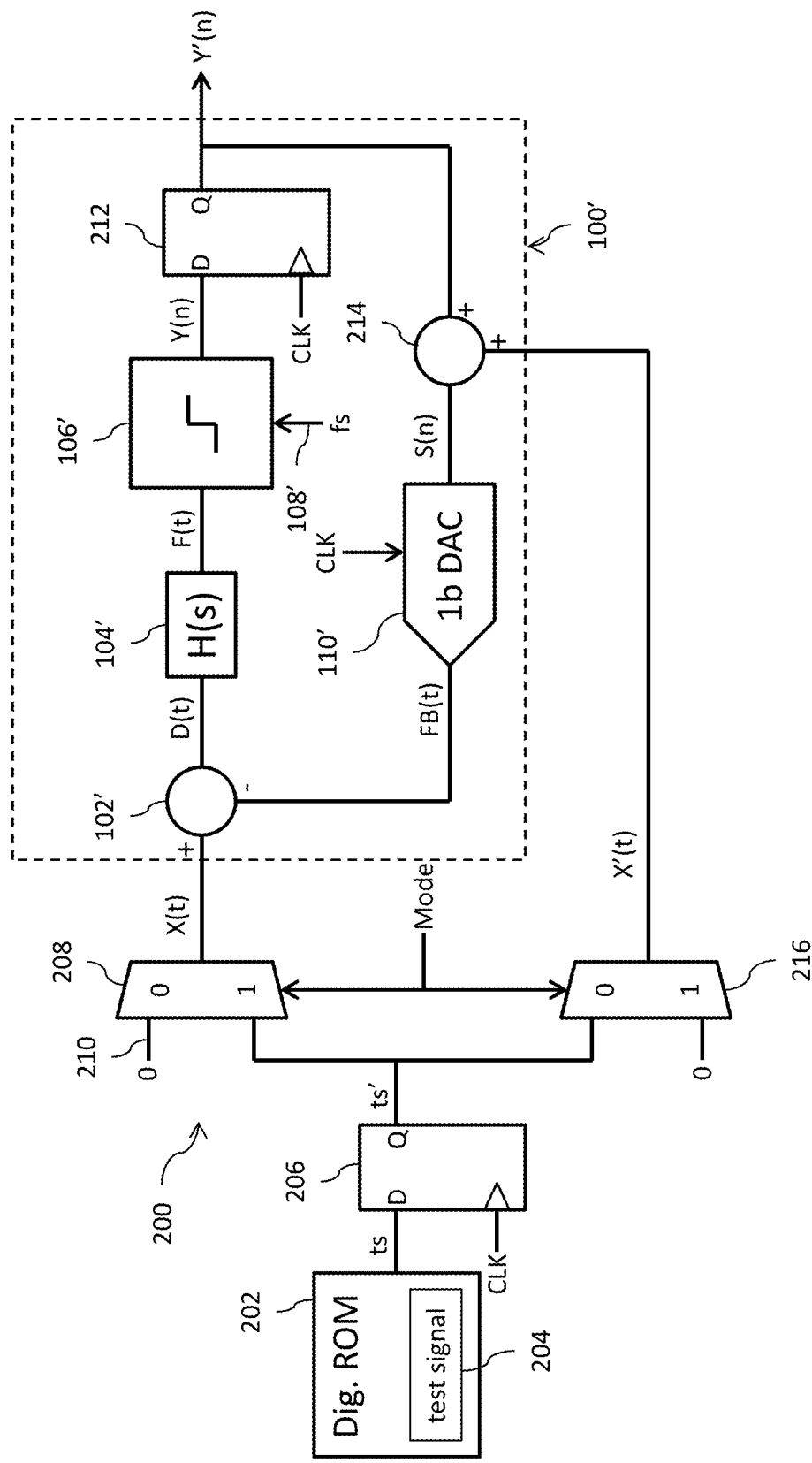
FIG. 4 is a block diagram of a jitter detection circuit.
Figure 5A:
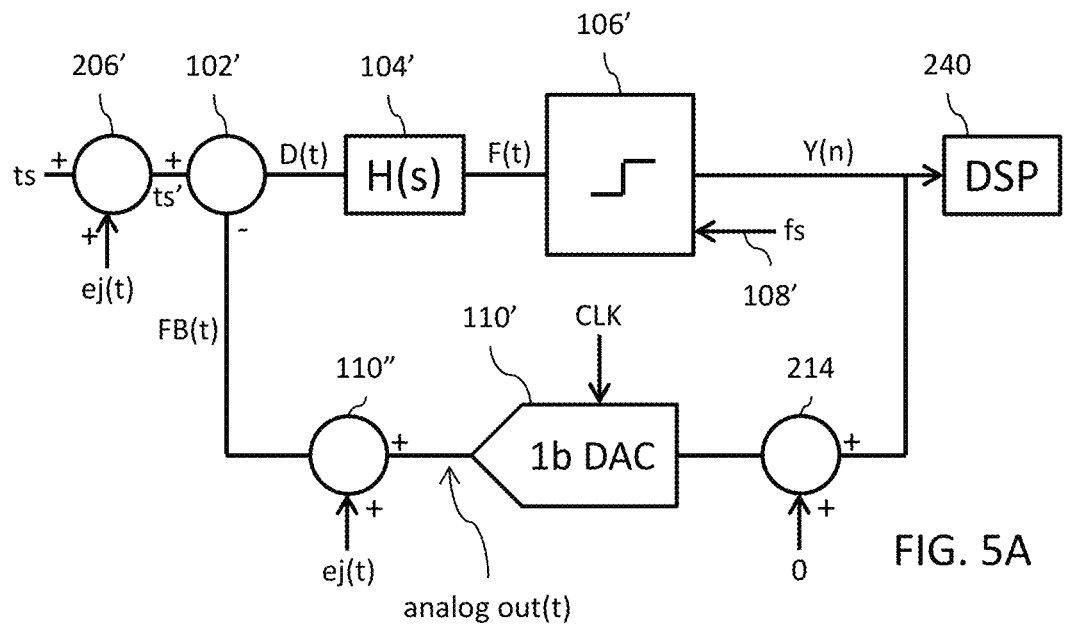
FIG. 5A schematically illustrates the calibration mode of operation for the circuit of FIG. 4.
Figure 5B:
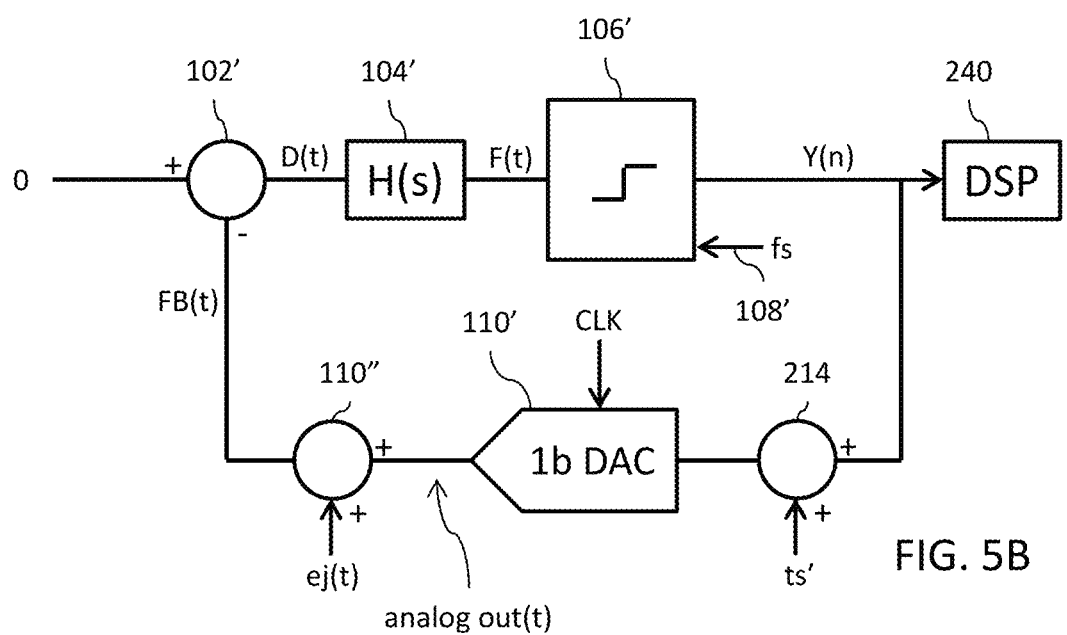
FIG. 5B schematically illustrates the jitter measurement mode of operation for the circuit of FIG. 4.

Reference is now made to FIG. 4 which shows a block diagram of a jitter detection circuit 200 whose output may be processed by a suitable digital signal processor (DSP) to make an accurate quantification of the detected jitter (see, reference 240, FIGS. 5A-5B). A digital memory 202, for example a digital read only memory (ROM), stores a digital test signal (ts) 204 in the form of a single bit PDM (Pulse Density Modulated) high performance single tone sinusoid. The digital test signal 204 is applied to the data input (D) of a flip-flop circuit 206 having a clock input configured to receive a clock signal CLK having jitter that is to be detected and measured. The flip-flop circuit 206 functions as an input circuit to interface the digital test signal 204 to the CT-ΔΣ modulator. By virtue of the digital test signal 204 being applied to the flip-flop circuit 206 which is running on a jittery clock CLK (i.e., the clock signal CLK having the jitter error), there is an introduction of jitter error into the digital test signal 204. This jitter error is referred to as a jitter error ej(t) signal which is effectively injected into and perturbs the test signal ts such that the output from the flip-flop circuit 206 is a jitter perturbed test signal ts'. The jitter perturbed test signal ts' output from the flip-flop circuit 206 is applied to one input of a switch (or multiplexer) circuit 208 which has another input configured to receive a logic low (or null) input signal 210 (i.e., a signal having a fixed voltage which in a preferred implementation is zero volts). The switching operation of the multiplexer circuit 208 is controlled by a mode signal (Mode). When the Mode signal is in a first logic state (for example, logic zero), the multiplexer circuit 208 passes the logic low (or null) input signal 210 for generating the input signal X(t). Conversely, when the Mode signal is in a second logic state (for example, logic one), the multiplexer circuit 208 passes the jitter perturbed test signal ts' from the output of the flip-flop circuit 206 for generating an input signal X(t).

The input signal X(t) is applied to the input of a single loop continuous time (CT) Delta-Sigma (ΔΣ) modulator 100'. A summation circuit 102' has a first input configured to receive the input signal X(t) and a second input configured to receive a feedback signal FB(t). The summation circuit 102' generates a difference signal D(t) that is equal to the difference between the input signal X(t) and the feedback signal FB(t); i.e., D(t)=X(t)−FB(t). A filter 104' has an input configured to receive the difference signal D(t) and an output configured to generate a filtered signal F(t). The filter 104' has a transfer function of H(s) and is generally implemented as one or more integrator circuits (not explicitly shown). The filtered signal F(t) is applied to the input of a quantization circuit (quantizer) 106'. The quantizer 106' samples and quantizes the filtered signal F(t) at a rate specified by a sampling signal 108' having a frequency fs to generate a digital output signal Y(n). The quantization circuit 106' is a single bit quantizer.

The digital output signal Y(n) is applied to the data input (D) of a flip-flop circuit 212 having a clock input configured to receive the clock signal CLK having jitter that is to be detected and measured. The flip-flop circuit 212 functions as an output circuit for interfacing the digital output signal Y(n) for further processing (such as with a digital signal processor circuit), the flip-flop circuit 212 generating the samples of the digital output signal Y(n) at the rate of the clock signal. It will be noted that any jitter effect introduced by the operation of the flip-flop circuit 212 can be ignored since this jitter effect is essentially high pass filtered by the loop and thus does not make a contribution to measurement operations.

A feedback loop of the CT-ΔΣ modulator 100' includes a summation circuit 214 having a first input configured to receive the digital output signal Y(n) and a second input (referred to as a test input of the CT-ΔΣ modulator 100') configured to receive a jitter degrading signal X'(t) that is output from a switch (or multiplexer) circuit 216. The summation circuit 214 generates a sum signal S(n) that is equal to the sum of the digital output signal Y(n) and the jitter degrading signal X'(t); i.e., S(n)=Y(n)+X'(t). The multiplexer circuit 216 has an input configured to receive the logic low (or null) input signal 210 and another input configured to receive the jitter perturbed test signal ts' output of the flip-flop circuit 206. The switching operation of the multiplexer circuit 216 is controlled by the mode signal (Mode). When the Mode signal is in the first logic state (for example, logic zero), the multiplexer circuit 216 passes the jitter perturbed test signal ts' from the output of the flip-flop circuit 206 for generating the jitter degrading signal X'(t). Conversely, when the Mode signal is in a second logic state (for example, logic one), the multiplexer circuit 216 passes the logic low (or null) input signal 210 for generating the jitter degrading signal X'(t).

The feedback loop further includes a digital-to-analog converter (DAC) circuit 110' that converts the sum signal S(n) from the digital domain to the analog domain. The DAC circuit 110' is clocked for operation by the clock signal CLK having jitter that is to be detected and operates to generate the feedback signal FB(t) as the analog conversion of the feedback signal FB(t). The DAC circuit 110' is implemented as a single bit converter. The clocking of the DAC circuit 110' with the clock signal CLK introduces the jitter error into the feedback signal FB(t).

In a first mode of operation, referred to as a calibration mode of operation, when the Mode signal is logic high, the multiplexer circuit 208 passes the jitter perturbed test signal ts' from the output of the flip-flop circuit 206 for generating the input signal X(t) and the multiplexer circuit 216 passes the logic low (or null) input signal 210 for generating the jitter degrading signal X'(t). The effect of this mode configuration is schematically illustrated in FIG. 5A. Reference 206' is schematically shown as a summation circuit representing the operation of the flip-flop 206 which outputs the jitter perturbed test signal ts' as a sum of the test signal ts and the jitter error ej(t) signal. Reference 110" is schematically shown as a summation circuit representing the injection of the jitter error ej(t) signal into the feedback signal FB(t) (i.e., FB(t)=analog out(t)+ej(t)). Because the Mode signal is logic high, the multiplexer circuit 216 passes the logic low (or null) input signal 210 and the summation circuit 214 shows the addition of the logic low (or null) input signal 210 to the digital output signal Y(n); thus, analog out(t) is the analog conversion of the digital output signal Y(n).

The structure of the circuit 200 shown in FIG. 4, and as schematically represented in the calibration mode of operation in FIG. 5A, is quite compact, and thus it can be safely be assumed that the jitter error ej(t) signal is identical at both the flip flop 206 and the DAC 110'. Thus, through the subtraction operation performed by the summation circuit 102', the jitter error ej(t) signal injected in the jitter perturbed test signal ts' is canceled by the jitter error ej(t) signal injected in the feedback signal FB(t). This ensures that the impact of clock jitter on the CT-ΔΣ modulator 100' performance is minimal. As will be known to those skilled in the art, there can be other ways to cancel out the effect of jitter effectively in a CT Sigma Delta Modulator. The one illustrated here in calibration mode is a trivial representation of the same. A Digital Signal Processor (DSP) circuit 240 connected to receive the digital output signal Y(n) operates to measure the native SNR performance in the prevalent Process Voltage Temperature (PVT) conditions and in the absence of clock jitter. The evaluated native SNR performance of the CT-ΔΣ modulator 100' sets a reference figure for subsequent use in connection with the detection and measurement of jitter in the clock signal CLK.

In a second mode of operation, referred to as a jitter measurement mode of operation, when the Mode signal is logic low, the multiplexer circuit 208 passes the logic low (or null) input signal 210 from the output of the flip-flop circuit 206 for generating the input signal X(t) and the multiplexer circuit 216 passes the jitter perturbed test signal ts' for generating the jitter degrading signal X'(t). The effect of this mode configuration is schematically illustrated in FIG. 5B. In comparison to FIG. 5A, it will be noted that the schematic illustration of FIG. 5B does not show reference 206' because the multiplexer circuit 208 is instead passing the logic low (or null) input signal 210 as the input signal X(t). Again, reference 110" is schematically shown as a summation circuit representing the injection of the jitter error ej(t) signal into the feedback signal FB(t) (i.e., FB(t) =analog out(t)+ej(t)). Because the Mode signal is logic low, the multiplexer circuit 216 passes the jitter perturbed test signal ts' from the output of the flip-flop circuit 206 and the summation circuit 214 shows the addition of the jitter perturbed test signal ts' to the digital output signal Y(n) before input to the DAC circuit 110'; thus, analog out(t) is the analog conversion of the sum of the digital output signal Y(n) and the jitter perturbed test signal ts' where the jitter perturbed test signal ts' includes the jitter error signal ej(t).

For the jitter measurement mode of operation, the summation circuit 214 functions to induce jitter, through the jitter perturbed test signal ts', as a degrading artifact in the feedback loop of the CT-ΔΣ modulator 100'. The jitter error ej(t) signal present in the jitter perturbed test signal ts' at the input of the DAC circuit 110' distorts the feedback signal FB(t). The area under the jittery DAC output pulses generating the feedback signal FB(t) is integrated by the filter 104' and is retained inside the loop. This results in SNR degradation of the digital output signal Y(n) which can be analyzed in the DSP circuit 240. The SNR degradation is inversely proportional to the RMS jitter in the system clock CLK as recognized by equations (5) and (6).

The DSP circuit 240 functions to compare the digital output signal Y(n) in the jitter measurement mode of operation to the digital output signal Y(n) in the calibration mode of operation (in effect, comparing the SNR performance of the CT-ΔΣ modulator 100' in the presence of clock CLK jitter against the evaluated native SNR performance of the CT-ΔΣ modulator 100' in absence of that clock CLK jitter). In particular, the DSP circuit 240 performs an output analysis using a sine-wave curve fitting algorithm which allows for the calculation of the signal-to-noise and distortion ratio (SNDR). It will be noted that due to the use of the digital test signal (ts) 204 in the form of a single bit PDM (Pulse Density Modulated) high performance single tone sinusoid, the digital output signal Y(n) in both the jitter measurement mode of operation and the calibration mode of operation will have the same frequency and furthermore they are both in phase due to the synchronization of the test. Accordingly, the complexity of the curve fitting algorithm is reduced.

In a first step, the DC value of the test response signal is calculated. The test response signal Sout here is the digital output signal Y(n) produced in the jitter measurement mode of operation. In this implementation, the calculation is made with 563 sampling points, but this is just by way of example:

$$DC = \frac{1}{563}\sum_{i=1}^{563} Sout[i] \qquad (7)$$

Next, a point-by-point correlation is evaluated between the test response signal Sout and the reference signal. The reference signal Sref here is the digital output signal Y(n) produced in the calibration mode of operation. By considering that the amplitude of the filtered sinusoidal reference signal is Ampref, the amplitude of the test response signal is given by:

$$Amp = 2 \cdot \frac{1}{563} \cdot \frac{1}{Ampref}\sum_{i=1}^{563} Sout[i] \cdot Sref[i] \qquad (8)$$

With knowledge of the DC value and the amplitude of the test response signal, a fit of the reference signal to match the response signal can then be made:

$$Sref, \text{fitted} = Amp \cdot \frac{1}{Ampref} \cdot Sref[i] + DC \qquad (9)$$

The fitted reference signal can now be compared with the test response to obtain the power of the error:

$$Perror = \frac{\sum_{i=1}^{563}(Sout[i] - Sref, \text{fitted}[i])^2}{563} \qquad (10)$$

All the constant values in equations (7), (8), (9) and (10) are known a priori and can be implemented as coefficient taps. Thus, on-chip implementations will have stored digital signatures for ideal and non-ideal error power and provide a direct estimate of the SNR of the signal by the DSP circuit.

The power of the error Perror can then be compared to a threshold, with the results of that threshold comparison providing an indication of whether the jitter error is too high. In such a case, the circuit may be rejected due to excessive clock jitter error.

The solution disclosed herein has been validated through MATLAB simulations for measuring the impact of clock jitter on a single tone of 400 KHz signal sampled by a 1 GHz clock. Clock jitter was quantified on basis of the measured SNR of the CT-ΔΣ modulator 100' output. It is clearly seen from FIG. 3C that the SNR degradation is systematic and directly related to the system clock jitter. This enables clock jitter characterization by evaluating the SNR of the reference sinusoid input.

Figure 6A:
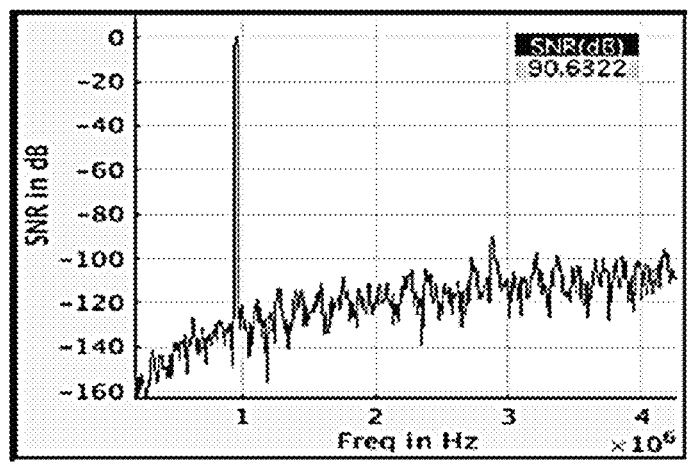
FIGS. 6A-6B illustrate in band frequency spectra for calibration mode and jitter measurement mode.
Figure 6B:
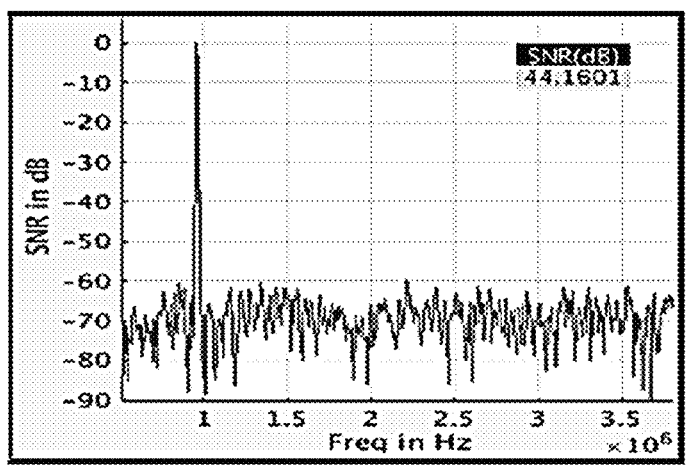

FIG. 6A illustrates an example of the in band frequency spectrum for a jitter-free scenario of the calibration mode of operation. The reference SNR from the FIG. 6A spectrum is measured in the calibration mode and is essentially free of any effects of jitter. FIG. 6B illustrates an example of the in band frequency spectrum for a 1 ps jitter degradation of the 1 GHz system clock in the jitter measurement mode of operation for a single tone 960 KHz input signal.

What is claimed is:

1. A circuit for detecting jitter in a clock signal, comprising:
   a continuous time Delta-Sigma modulator circuit having an input node configured to receive an input signal, an output node configured to output a digital output signal, and a test input configured to receive a jitter perturbed test signal;
   a signal source circuit configured to generate a single tone signal;
   a jitter injection circuit configured to inject the jitter of the clock signal into the single tone signal to output the jitter perturbed test signal; and
   a processing circuit configured to process the digital output signal to detect a signal to noise ratio of the continuous time Delta-Sigma modulator circuit in response to the input signal and the jitter perturbed test signal, wherein the signal to noise ratio is indicative of presence of jitter in the clock signal.

2. The circuit of claim 1, wherein the input signal is a fixed voltage signal.

3. The circuit of claim 1, wherein the jitter injection circuit comprises a flip flop having a data input configured to receive the single tone signal and a clock input configured to receive the clock signal.

4. The circuit of claim 1, wherein the continuous time Delta-Sigma modulator circuit further includes:
   a feedback loop including a digital to analog converter circuit having an input configured to receive a signal which is a sum of the digital output signal with the jitter perturbed test signal;
   a filter circuit configured to filter a signal which is a difference between the input signal and a feedback signal output by the digital to analog converter circuit of the feedback loop; and
   a quantization circuit configured to quantize an output of the filter circuit to generate the digital output signal.

5. The circuit of claim 4, wherein the digital to analog converter circuit is clocked by the clock signal.

6. The circuit of claim 4, wherein the continuous time Delta-Sigma modulator circuit further includes an output circuit comprising a flip flop having a data input configured to receive the output of the quantization circuit and a clock input configured to receive the clock signal.

7. The circuit of claim 4, wherein the digital to analog converter circuit is a single bit digital to analog converter circuit and wherein the quantization circuit is a single bit quantization circuit.

8. The circuit of claim 4, wherein the filter circuit has a transfer function for an integrator.

9. The circuit of claim 1, wherein the single tone signal is a PDM (Pulse Density Modulated) single tone sinusoid.

10. The circuit of claim 1, wherein the continuous time Delta-Sigma modulator circuit includes a feedback loop with a summation circuit configured to sum the digital output signal with the jitter perturbed test signal.

11. The circuit of claim 10, further comprising:
    a first switching circuit configured to apply the input signal to the input node of the continuous time Delta-Sigma modulator circuit in a jitter testing mode of operation; and
    a second switching circuit configured to apply the jitter perturbed test signal to the summation circuit in the jitter testing mode of operation.

12. The circuit of claim 11, wherein:
    the first switching circuit is further configured to instead apply the jitter perturbed test signal to the input node of the continuous time Delta-Sigma modulator circuit in a calibration mode of operation; and
    the second switching circuit is further configured to instead apply the input signal to the summation circuit in the calibration mode of operation.

13. The circuit of claim 12, wherein the processing circuit is further configured to process the digital output signal generated in the calibration mode of operation to detect a native signal to noise ratio of the continuous time Delta-Sigma modulator circuit.

14. The circuit of claim 13, wherein the processing circuit is further configured to compare the detected signal to noise ratio of the continuous time Delta-Sigma modulator circuit in the jitter testing mode of operation to the detected native signal to noise ratio of the continuous time Delta-Sigma modulator circuit in the calibration mode of operation in order to determine a signal to noise ratio degradation due to jitter in the clock signal.

15. The circuit of claim 14, wherein the comparison performed by the processing circuit comprises:
    correlating the digital output signal in the calibration mode of operation to the digital output signal in the jitter testing mode of operation;
    fitting of the digital output signal in the calibration mode of operation to the digital output signal in the jitter testing mode of operation based on the correlation; and
    comparing the fitted digital output signal in the calibration mode of operation to the digital output signal in the jitter testing mode of operation to obtain an error value.

16. The circuit of claim 15, wherein the processing circuit is further configured to compare the error value to a threshold.

17. The circuit of claim 1, wherein the processing circuit is further configured to compare the detected signal to noise ratio of the continuous time Delta-Sigma modulator circuit to a native signal to noise ratio of the continuous time Delta-Sigma modulator circuit in order to determine a signal to noise ratio degradation due to jitter in the clock signal.

18. The circuit of claim 17, wherein the comparison performed by the processing circuit comprises:
    correlating the digital output signal to a native digital output signal in the absence of jitter in the clock signal;
    fitting of the native digital output signal to the digital output signal; and
    comparing the fitted native digital output signal to the digital output signal to obtain an error value.

19. The circuit of claim 18, wherein the processing circuit is further configured to compare the error value to a threshold.

20. A circuit, comprising:
    a signal source circuit configured to generate a single tone signal;
    a jitter injection circuit configured to inject a jitter error of a clock signal into the single tone signal to output a jitter perturbed test signal;

a first switching circuit having a first input configured to receive a fixed voltage signal and a second input configured to receive the jitter perturbed test signal;

a second switching circuit having a first input configured to receive the jitter perturbed test signal and a second input configured to receive the fixed voltage signal; and a continuous time Delta-Sigma modulator circuit comprising:
  a first summation circuit having a first input coupled to receive an output of the first switching circuit and a second input coupled to receive a feedback signal;
  a filter circuit having an input coupled to an output of the first summation circuit;
  a quantization circuit having an input coupled to an output of the filter circuit and an output configured to generate a digital output signal; and
  a feedback loop including:
    a second summation circuit having an first input coupled to receive the digital output signal and a second input coupled to receive an output of the second switching circuit; and
    a digital to analog converter circuit having an input coupled to receive an output of the second summation circuit and an output configured to generate the feedback signal.

21. The circuit of claim 20, wherein the jitter injection circuit comprises a flip flop having a data input configured to receive the single tone signal and a clock input configured to receive the clock signal.

22. The circuit of claim 20, wherein the digital to analog converter circuit is clocked by the clock signal.

23. The circuit of claim 20, wherein the continuous time Delta-Sigma modulator circuit further comprises an output circuit configured output the digital output signal at a rate of the clock signal.

24. The circuit of claim 23, wherein the output circuit comprises a flip flop having a data input configured to receive the quantized signal and a clock input configured to receive the clock signal.

25. The circuit of claim 20, wherein the digital to analog converter circuit is a single bit digital to analog converter circuit and wherein the quantization circuit is a single bit quantization circuit.

26. The circuit of claim 20, wherein the filter circuit has a transfer function for an integrator.

27. The circuit of claim 20, wherein the single tone signal is a PDM (Pulse Density Modulated) single tone sinusoid.

28. The circuit of claim 20, further comprising a processing circuit configured to process the digital output signal to detect a signal to noise ratio of the continuous time Delta-Sigma modulator circuit that is indicative of presence of jitter in the clock signal.

29. The circuit of claim 20, wherein switching by the first and second switching circuits is controlled by a mode signal such that:
  when the mode signal is in a first state the circuit is configured in a calibration mode of operation and the first and second switching circuits are switched to output the jitter perturbed test signal and the fixed voltage signal, respectively, and
  when the mode signal is in a second state the circuit is configured in a jitter measurement mode of operation and the first and second switching circuits are switched to output the fixed voltage signal and the jitter perturbed test signal, respectively.

30. The circuit of claim 29, further comprising a processing circuit, wherein the processing circuit is configured to:
  in the calibration mode of operation, process the digital output signal to detect a native signal to noise ratio of the continuous time Delta-Sigma modulator circuit; and
  in a jitter measurement mode of operation, process the digital output signal to detect a signal to noise ratio of the continuous time Delta-Sigma modulator circuit;
  the processing circuit further configured to compare the signal to noise ratio and native signal to noise ratio to determine a signal to noise ratio degradation due to jitter in the clock signal.

31. The circuit of claim 29, further comprising a processing circuit, wherein the processing circuit is configured to:
  correlate the digital output signal in the calibration mode of operation to the digital output signal in the jitter testing mode of operation;
  fit the digital output signal in the calibration mode of operation to the digital output signal in the jitter testing mode of operation based on the correlation; and
  compare the fitted digital output signal in the calibration mode of operation to the digital output signal in the jitter testing mode of operation to obtain an error value indicative of the presence of jitter in the clock signal.

32. The circuit of claim 31, wherein the processing circuit is further configured to compare the error value to a threshold.

* * * * *